United States Patent
Chen et al.

(10) Patent No.: US 7,161,798 B2
(45) Date of Patent: Jan. 9, 2007

(54) EXPANSION CARD RETENTION APPARATUS

(75) Inventors: Yun Lung Chen, Tu-chen (TW); Ding Lin, Shenzhen (CN); Zhou Xu, Shenzhen (CN)

(73) Assignees: Hong Fu Jin Precision Ind(Shenzhen) Co., Ltd., Shenzhen (CN); Hon Hai Precision Ind. Co., Ltd., Tu-Cheng (TW)

( * ) Notice: Subject to any disclaimer, the term of this patent is extended or adjusted under 35 U.S.C. 154(b) by 121 days.

(21) Appl. No.: 10/940,246

(22) Filed: Sep. 13, 2004

(65) Prior Publication Data

US 2005/0059285 A1    Mar. 17, 2005

(30) Foreign Application Priority Data

Sep. 12, 2003    (TW) ............... 92216489 U

(51) Int. Cl.
*G06F 1/16* (2006.01)

(52) U.S. Cl. .................. 361/679; 361/683
(58) Field of Classification Search .......... 361/679, 361/683

See application file for complete search history.

(56) References Cited

U.S. PATENT DOCUMENTS 5,317,483 A    5/1994   Swindler
5,575,546 A *  11/1996  Radloff ................ 312/183
5,601,349 A    2/1997   Holt
5,694,291 A *  12/1997  Feightner ............. 361/683
6,215,668 B1   4/2001   Hass et al.
6,549,398 B1*  4/2003   Chen .................... 361/683

FOREIGN PATENT DOCUMENTS

TW        472906        1/2002

* cited by examiner

*Primary Examiner*—Yean-Hsi Chang
(74) *Attorney, Agent, or Firm*—Wei Te Chung

(57) ABSTRACT

An expansion card retention apparatus includes a rear panel (50), first and second retention brackets (10, 30), and a side panel (59). The rear panel defines a number of expansion slots (52) for receiving expansion cards (60) therein respectively, an opening, and a pair of hook openings adjoining the opening. The first retention bracket is rotatable in the opening between first and second positions, and includes a pair of hooks (16). The second retention bracket defines a number of flexible tongues (311). The first and second retention brackets are together rotated to the second position such that the flexible tongues engage corresponding expansion cards, and the hooks engages in corresponding hook openings of the rear panel. The side panel is attached to the rear panel for holding the first and second retention brackets in place. The expansion cards are thus securely attached to the rear panel.

19 Claims, 5 Drawing Sheets

EXPANSION CARD RETENTION APPARATUS

BACKGROUND OF THE INVENTION

1. Field of the Invention

The present invention relates to a retention apparatus for computer systems, and more particularly to a retention apparatus for expansion cards of a computer.

2. Description of the Related Art

Microprocessor based computer systems typically require or include facilities for connecting one or more expansion cards to the system. Expansion cards extend the capabilities of computer systems by providing dedicated hardware to achieve a variety of tasks. Graphics adapters, high speed network controllers, hard disk controllers, sound cards, and modem cards are among some of the more common types of expansion cards, although those knowledgeable in the field of computer systems will recognize a wide variety of other types of expansion cards.

Typically, expansion cards are interfaced to the microprocessor (or microprocessors in a multi-processor system) by physically inserting the expansion card into an expansion card connector of a motherboard. In many cases, the expansion card comprises facilities for making an external connection to the expansion card. A network adapter card, as an example, typically comprises a socket for connecting an external cable to the adapter card. The expansion card must be maintained in a precise position such that the socket is accessible. Moreover, because external connections to expansion cards are achieved by incorporating expansion slots in a chassis of a computer system, it is important to maintain the positioning of expansion cards within their respective expansion card connectors during system operation to insure reliable operation. Those familiar with expansion cards and expansion card connectors will appreciate the ease with which a slight displacement or movement of the expansion card can result in a faulty connection. Thus, maintaining precise positioning of expansion cards is an important issue in the design and manufacturing of computer systems. Historically, the secure positioning of expansion cards was maintained by screwing each expansion card into place with one or more securing screws. Unfortunately, the use of separate screws to secure each expansion card undesirably increases the amount of time and effort required to install, remove, replace, and otherwise service the expansion cards in a system.

A significant amount of effort has been devoted to simplifying the means by which the positioning of expansion cards is maintained. See for example U.S. Pat. No. 6,215,668, which teaches a complex retaining unit for securing an expansion card via the application of a wedging force; and Taiwan Pat. No. 472906, which discloses a slidable block and a support base mechanism for engaging expansion cards. Unfortunately, these inventions typically require highly intricate retention structures and a rotating or sliding mechanism, which introduces undesirably expensive extra hardware to the system component list.

SUMMARY OF THE INVENTION

Accordingly, an object of the present invention is to provide an expansion card retention apparatus which can conveniently attach an expansion card to a computer chassis.

Another object of the present invention is to provide an easily manufactured and inexpensive expansion card retention apparatus.

To achieve the above objects, an expansion card retention apparatus in accordance with the present invention comprises a rear panel, a first retention bracket, a second retention bracket, and a side panel. The rear panel defines a plurality of expansion slots for receiving a plurality of expansion cards each having a slot cover therein, an opening in communication with the expansion slots, and a pair of hook openings adjoining the opening. The first retention bracket is detachably attached to the rear panel in the opening and rotatable between first and second positions. The first retention bracket comprises a pair of hooks corresponding to the hook openings. The second retention bracket is detachably attached to the first retention bracket, and comprises a plurality of flexible tongues corresponding to the expansion slots of the rear panel. The first and second retention brackets are together rotated to the second position such that the flexible tongues engage corresponding expansion cards, and the hooks engages in corresponding hook openings of the rear panel. The side panel is attached to the rear panel for holding the first and second retention brackets in place. The expansion cards are thus securely attached to the rear panel. To remove the expansion cards from the rear panel, the side panel is detached from the rear panel, and the first and second retention brackets are rotated to the first position. The expansion cards are then readily detached from the rear panel.

Other objects, advantages and novel features of the present invention will be drawn from the following detailed description of preferred embodiments of the present invention with the attached drawings, in which:

DETAIL DESCRIPTION OF THE PRESENT INVENTION

Figure 1:
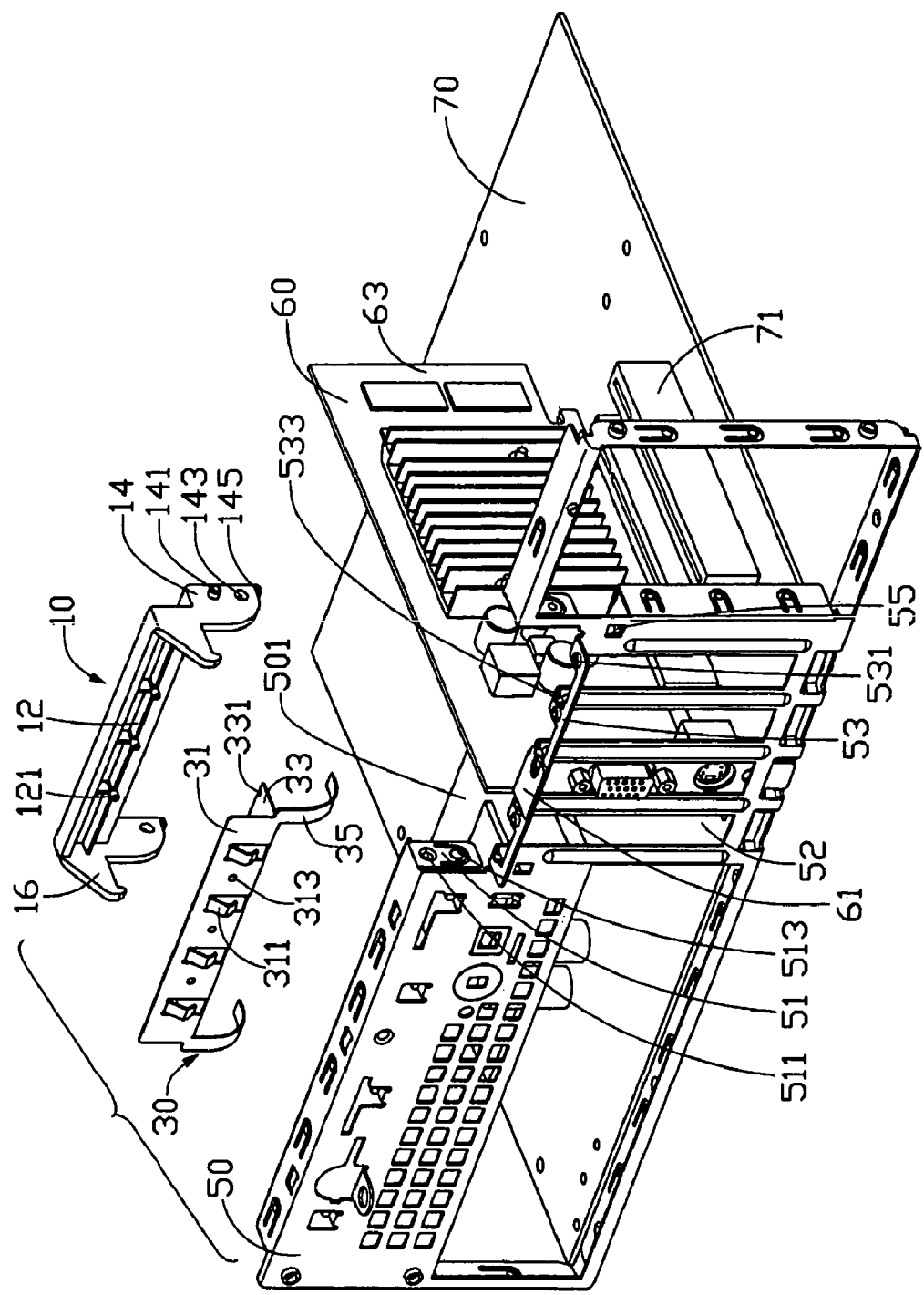
FIG. 1 is an exploded, isometric view of an expansion card retention apparatus in accordance with a preferred embodiment of the present invention together with an expansion card, the expansion card retention apparatus comprising a rear panel, a first retention bracket, a second retention brackets, and a side panel, but the side panel omitted from FIG. 1.
Figure 4:
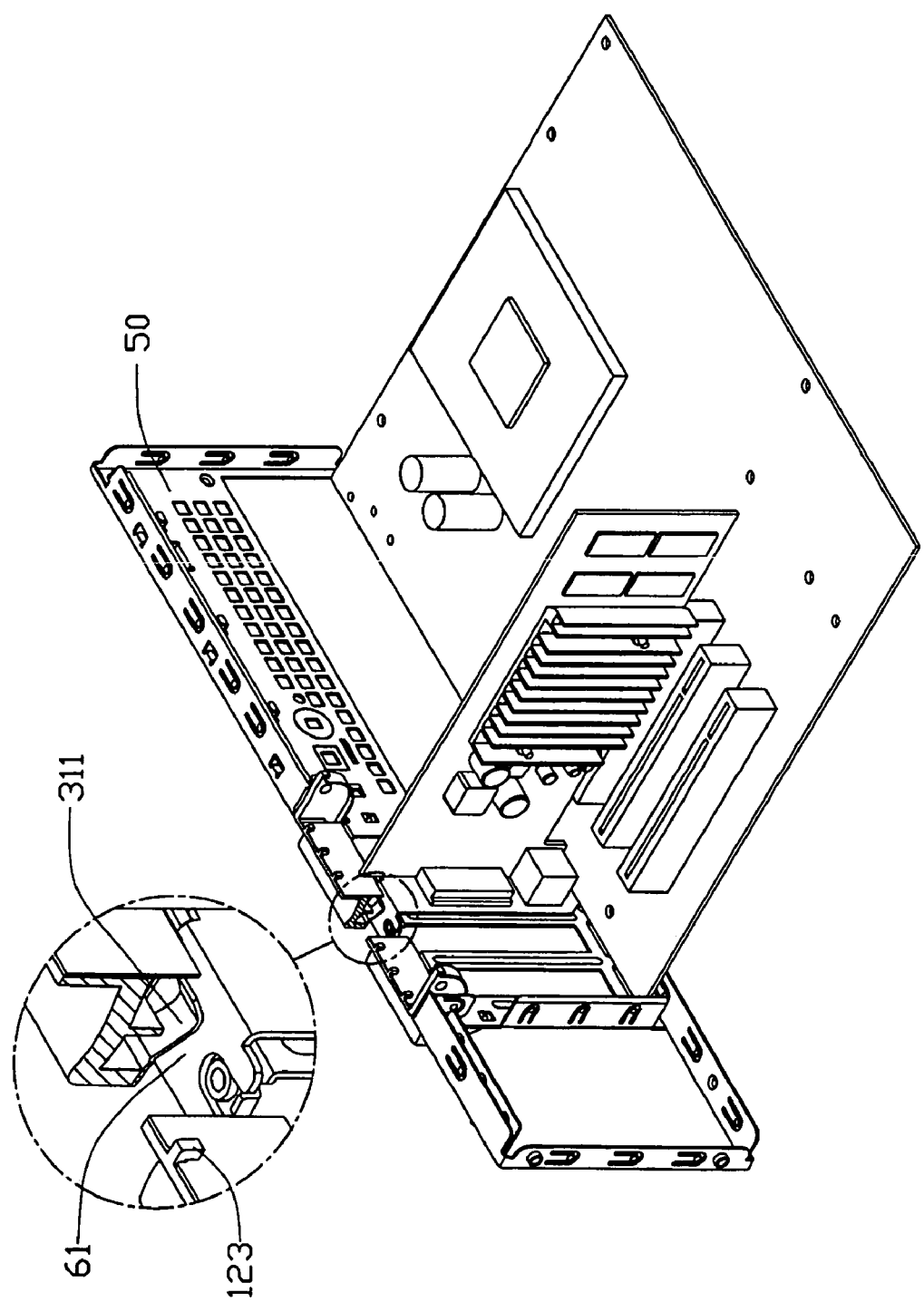
FIG. 4 is similar to FIG. 3, but viewed from another aspect.
Figure 5:
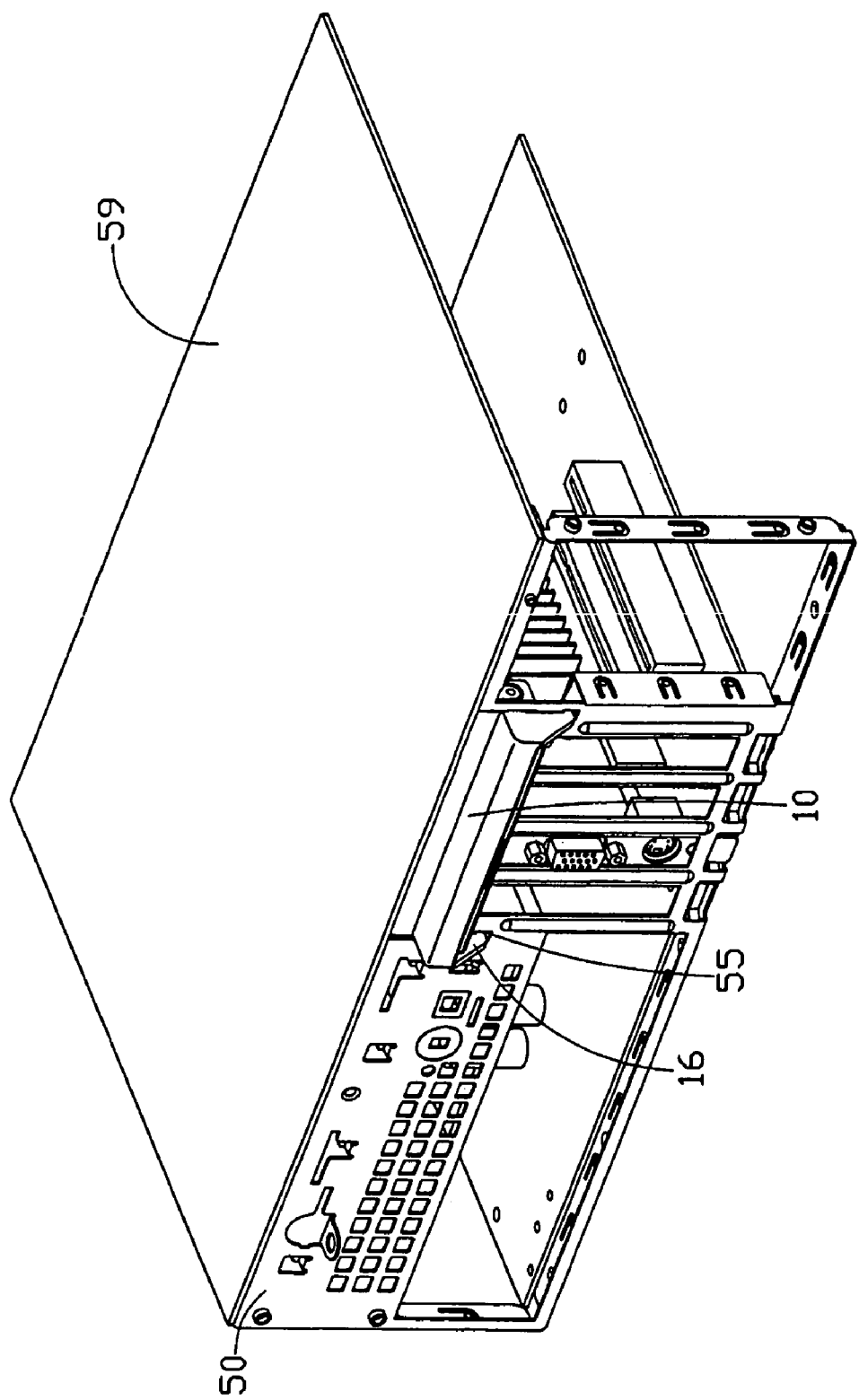
FIG. 5 is similar to FIG. 3, but showing the side panel attached to the first panel.

Referring to FIGS. 1, 4 and 5, a retention apparatus in accordance with the preferred embodiment of the present invention is provided for attaching at least one expansion card 60 in a computer chassis. The retention apparatus comprises a first retention bracket 10, and a second retention bracket 30.

The first retention bracket 10 comprises a connecting plate 12, a pair of end plates 14 formed at opposite ends of the connecting plate 12, and a pair of hooks 16 extending from the connecting plate 12 adjoining the end plates 14 respectively. The connecting plate 12 is generally stepshaped. A plurality of pins 121 protrudes from the connecting plate 12 in a direction generally parallel to the hooks 16. A plurality of aligned catches 123 is perpendicularly formed on a free edge distal from the hooks 16. A pair of pivots 141 protrudes perpendicularly outwardly from the end plates 14 respectively. A pair of apertures 143 is defined in the end plates 14 adjacent the pivots 141 respectively. A pair of bent tabs 145 is formed at corners of the end plates 14 adjacent the apertures 143 respectively, and a receiving space is defined between each bent tab 145 and a respective arcuate surface of each end plates 14.

The second retention bracket 30 is generally L-shaped, and comprises a first plate 31, and a second plate 33 generally perpendicular to the first plate 31. A plurality of spaced cantilevered flexible tongues 311 is formed from the first plate 31. A plurality of through holes 313 is defined in the first plate 31, for receiving the pins 121 of the first retention bracket 10. A plurality of cutouts 331 is defined in the second plate 33, for receiving the catches 123 of the first retention bracket 10. Two arcuate flexible strips 35 extend from a common edge of the first and second plates 31, 33, corresponding to the arcuate surfaces of the end plates 14 of the first retention bracket 10 respectively. A free end of each strip 35 is to be inserted in corresponding receiving place of the first retention bracket 10.

The computer chassis comprises a rear panel 50, and a side panel 59 attachable to the rear panel 50. The rear panel 50 defines an opening 501 in an edge section at a middle portion thereof. A pair of opposite support plates 51 is bent perpendicularly in the opening 501 from an edge of the edge section. A pair of pivot holes 511 is defined in the support plates 51 respectively, for receiving the pivots 141 of the first retention plate 10. A pair of protrusions 513 is formed on the support plates 51 respectively proximate to free ends thereof, corresponding to the apertures 143 of the first retention plate 10. A vertical bent tab 53 is bent perpendicularly outwardly from the rear panel 50 adjoining the opening 501. A plurality of spaced parallel vertical expansion slots 52 is defined in the middle portion of the rear panel 50, in communication with the opening 501. A post 531 and a tab 533 are respectively located adjoining opposite sides of each expansion slot 52 on the bent plate 53. A hook opening 55 is defined in the middle portion adjacent each end of the bent plate 53, the hook opening 55 being located away from the expansion slots 52. The hook opening 55 corresponds to a corresponding hook 16 of the first retention plate 10.

The expansion card 60 comprises a printed circuit board 63 for insertion into a respective expansion card connector 71 of a motherboard 70 located in the computer chassis, and an L-shaped slot cover 61 perpendicularly disposed at an end edge of the printed circuit board 63. A lip portion (not labeled) of the expansion card 60 is to be sandwiched between a corresponding post 531 and a corresponding tab 533.

In assembly and use of the retention apparatus, the second retention bracket 30 is attached to the first retention bracket 10. The pins 121 and the catches 123 of the first retention bracket 10 are engaged in corresponding through holes 313 and corresponding cutouts 331 respectively. The free ends of the strips 35 of the second retention bracket 30 are clasped in corresponding receiving places of the first retention bracket 10. The combined first and second retention brackets 10, 30 is pivotably attached in the opening 501 of the rear panel 50, with pivots 141 of the first retention bracket 10 received in the pivot holes 511 of the rear panel 50 respectively.

Figure 2:
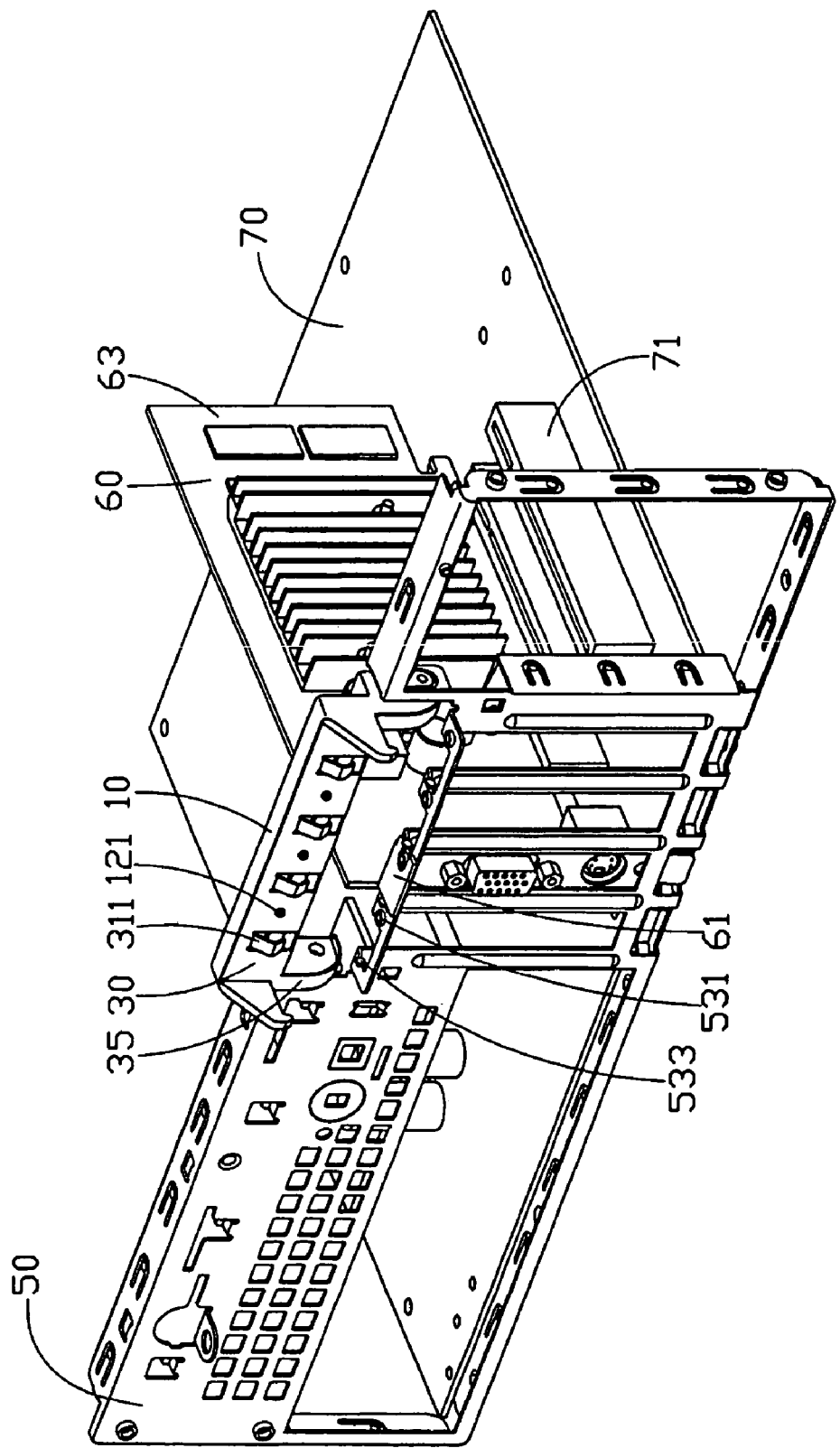
FIG. 2 is an assembled view of FIG. 1, showing the combined first and second retention brackets at a first position.

Referring to FIG. 2, in this state, the combined first and second retention brackets 10, 30 is positioned at a first or open position while the protrusions 513 of the rear panel 50 snappingly engage in the apertures 143 of the first retention bracket 10 respectively. The hooks 16 of the first retention bracket 10 are generally perpendicular to the rear panel 50. Then, the expansion card 60 is attached to the motherboard 70. The expansion card 60 is positioned so that the slot cover 61 covers one of the expansion slots 52, and the lip portion of the slot cover 61 is clamped between corresponding post 531 and tab 533 of the bent plate 53 of the rear panel 30.

Figure 3:
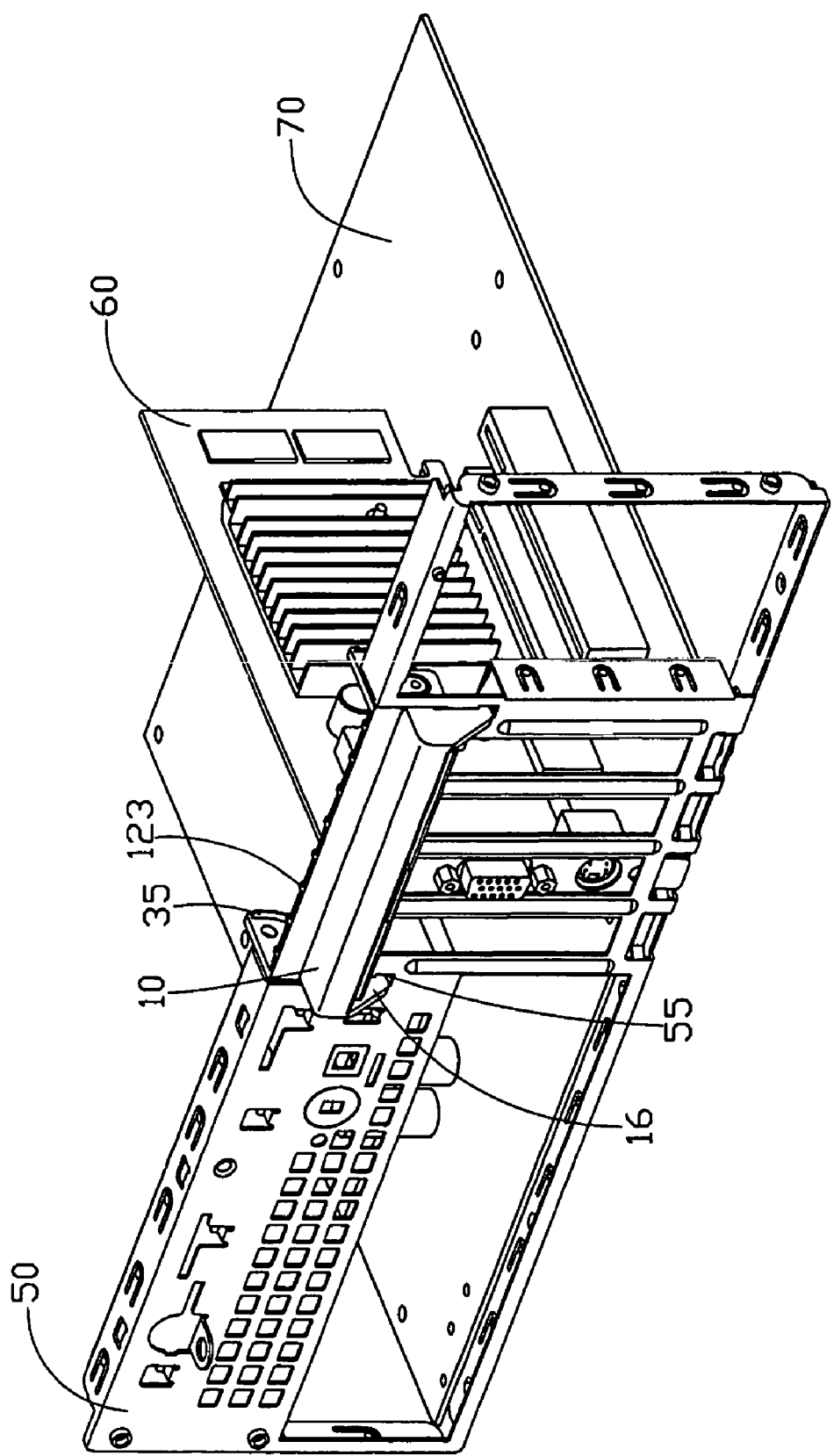
FIG. 3 is similar to FIG. 2, but showing the combined first and second retention brackets at a second position.

Then, the combined first and second retention brackets 10, 30 is slid toward the expansion slots 39 to a second or closed position as showed in FIGS. 3 and 4. The protrusions 513 of the rear panel 50 are disengaged from the apertures 143 of the first retention bracket 10. The hooks 16 of the first retention bracket 10 are inserted into the hook openings 55 of the rear panel 50 respectively. A corresponding tongue 311 of the second retention bracket 30 cooperates with the bent plate 53 of the rear panel 50 to sandwich the lip portion of the expansion card 60 therebetween.

Then, the side panel 59 is attached to the rear panel 50, for preventing the combined first and second brackets 10, 30 from reverse rotation, see FIG. 5. The expansion card 60 is thus securely attached to the rear panel 50.

To remove the expansion card 60 from the rear panel 50, the side panel 59 is detached from the rear panel 50, and the combined first and second retention brackets 10, 30 is rotated to the first position. The expansion card 60 is then readily detached from the rear panel 50.

Although only one expansion card 60 has been described above, the retention apparatus of the present invention is equally capable of mounting a plurality of expansion cards 50 at the same time. The first and second retention brackets 10, 30 can be integrally formed.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A retention apparatus for attaching expansion cards in a computer chassis, each of the expansion cards comprising a slot cover, the retention apparatus comprising:
    a first panel defining a plurality of expansion slots corresponding to the expansion cards, an opening in communication with the expansion slots, and at least one hook opening adjoining the opening; and
    a retention bracket pivotally attached to the first panel in the opening and rotatable between first and second positions, the retention bracket comprising at least one hook engagable in the at least one hook opening of the first panel at the second position, the at least one hook disengaging and leaving away from the at least one hook opening of the first panel at the first position;
    wherein the retention bracket is rotated outwardly in a direction generally perpendicular to the first panel from the first position to the second position, for the retention bracket attaching the expansion cards to the first panel.

2. The retention apparatus as claimed in claim 1, wherein the retention bracket comprises a connecting plate, and a pair of end plates arranged at opposite ends of the connecting plate.

3. The retention apparatus as claimed in claim 2, wherein a pair of pivots is formed on the end plates of the retention bracket respectively, and a pair of pivot holes is defined in a pair of support plates bent from the first panel in the opening, corresponding to the pivots of the first retention bracket respectively.

4. The retention apparatus as claimed in claim 3, wherein a pair of apertures is defined adjacent the pivots respectively, a pair of protrusions is formed on the support plates and snappishly engages in the apertures respectively at the first position.

5. The retention apparatus as claimed in claim 1, wherein a second panel is attached to the first panel to hold the retention bracket in the computer chassis.

6. The retention apparatus as claimed in claim 1, wherein a plurality of flexible tongues is formed an the retention bracket to press the expansion cards respectively.

7. The retention apparatus as claimed in claim 1, wherein a post is formed on the first panel adjacent each of the expansion slots, for engaging a side of a corresponding expansion card.

8. The retention apparatus as claimed in claim 7, whereIn a tab is formed on the first panel corresponding to the post, for engaging an opposite side of the corresponding expansion card.

9. The retention apparatus as claimed in claim 1, wherein a pair of pivots is formed on one of the retention bracket and the first panel, and a pair of pivot holes is defined in the other of the retention bracket and the first panel corresponding to the pivots respectively.

10. The retention apparatus as claimed in claim 9, wherein at least one aperture is defined in one of the retention bracket and the first panel, and at least one protrusion is formed an the other of the retention bracket and the first panel end snappishly engages in the at least one aperture at the first position.

11. A retention apparatus assembly comprising:
a plurality of expansion cards each comprising a slot cover having a lip portion;
a first panel, a bent plate formed from the first panel, a plurality of expansion slots defined in the first panel and receiving the slot covers of the expansion cards therein respectively, an opening defined in the first panel adjacent the bent plate;
a retention bracket attached to the first panel and rotatable in a direction generally perpendicular to the first panel to selectively engage the lip portion of the expansion card to the bent plate or disengage from the lip portion; and
a second panel detachably attached to the first panel to press the retention bracket against the bent plate, thereby holding the retention bracket in place.

12. The retention apparatus assembly as claimed in claim 11, wherein a pair of opposite support plates is formed in the opening from an edge of the first panel supporting the retention bracket therebetween.

13. The retention apparatus assembly as claimed in claim 12, wherein a pair of pivots is formed on opposite ends of the retention bracket respectively, and a pair of pivot holes is defined in the support plates, corresponding to the pivots of the retention bracket respectively.

14. The retention apparatus assembly as claimed in claim 13, wherein a pair of apertures is defined in the retention bracket adjacent the pivots respectively, and a pair of protrusions is formed on the support plates engaging in the apertures of the retention bracket respectively.

15. The retention apparatus assembly as claimed in claim 11, wherein a plurality of flexible tongues is formed on the retention bracket engaging the lip portion of the expansion card.

16. The retention apparatus assembly as claimed in claim 11, wherein a pair of hooks is formed from the retention bracket, and a pair of hook openings is defined in the first panel receiving the hooks of the retention bracket therein respectively.

17. The retention apparatus assembly as claimed in claim 11, wherein a post is formed on the bent plate to cooperate with the tab for clamping the lip portion therebetween.

18. A retention apparatus assembly comprising:
a panel defining a plurality of expansion slots;
a plurality of expansion cards defining slot covers positioned upon the panel and covering the corresponding expansion slots, respectively; and
a retention bracket assembly detachably attached to the panel and rotatable between first and second positions, the retention bracket assembly comprising one rigid bracket and one resilient bracket associated with each other, wherein
said rigid bracket forms means for pivotally mounting to the panel and means for locating said retention bracket assembly in either the first or the second position, and said resilient bracket forms means for cooperating with the panel to sandwich the corresponding slot covers therebetween.

19. The retention apparatus assembly as claimed in claims 18, wherein the slot covers are sandwiched between the resilient bracket assembly and the panel in a direction perpendicular to another direction defined by a rotation axis about which said retention bracket is pivoted.

* * * * *